United States Patent [19]

Petitjean et al.

[11] Patent Number: 4,882,504

[45] Date of Patent: Nov. 21, 1989

[54] INTERRUPTER ARRANGEMENT FOR HIGH-FREQUENCY SIGNALS

[75] Inventors: Gilbert Petitjean, Igny; Michel Lebourg, Clamart, both of France

[73] Assignee: U.S. Philips Corporation, New York, N.Y.

[21] Appl. No.: 221,153

[22] Filed: Jul. 19, 1988

[30] Foreign Application Priority Data

Jul. 24, 1987 [FR] France ................. 87 10581

[51] Int. Cl.⁴ ............... H03K 17/74; H03K 5/08; H03B 1/04; H02H 7/20
[52] U.S. Cl. .................... 307/256; 307/258; 307/300; 307/542; 307/544; 307/545; 328/8; 328/169; 361/86; 361/91
[58] Field of Search ........... 307/256, 258, 259, 264, 307/280, 300, 542, 544, 545, 288, 64, 66; 328/8, 10, 168, 169, 172; 361/86, 91

[56] References Cited

U.S. PATENT DOCUMENTS 3,813,561  5/1974  Williams et al. ............. 307/256
3,912,949 10/1975  Kalisvaart .................. 307/268
4,689,498  8/1987  Rinderle .................... 307/256

FOREIGN PATENT DOCUMENTS 0151822 11/1980 Japan ...................... 307/256

Primary Examiner—Stanley D. Miller
Assistant Examiner—Trong Quang Phan
Attorney, Agent, or Firm—Algy Tamoshunas; Leroy Eason

[57] ABSTRACT

A PIN diode is in series in a high-frequency signal path between an input and an output, and is controllably biased either on or off by a control signal supplied thereto from the output of a control circuit in response to a command voltage. The control circuit derives the control signal from a positive voltage source when the diode is to be turned on and from a negative voltage source when the diode is to be turned off. The negative voltage must be a relatively high value, which can cause excessive power dissipation in the control circuit due to charging of the bypass capacitance present at the output terminal thereof for shunting high frequencies. To prevent that, the control circuit includes an overvoltage circuit which produces a short duration trigger pulse in response to change-over from the positive voltage source to the negative voltage source and which supplies a current pulse of brief duration for charging the bypass capacitance.

4 Claims, 1 Drawing Sheet

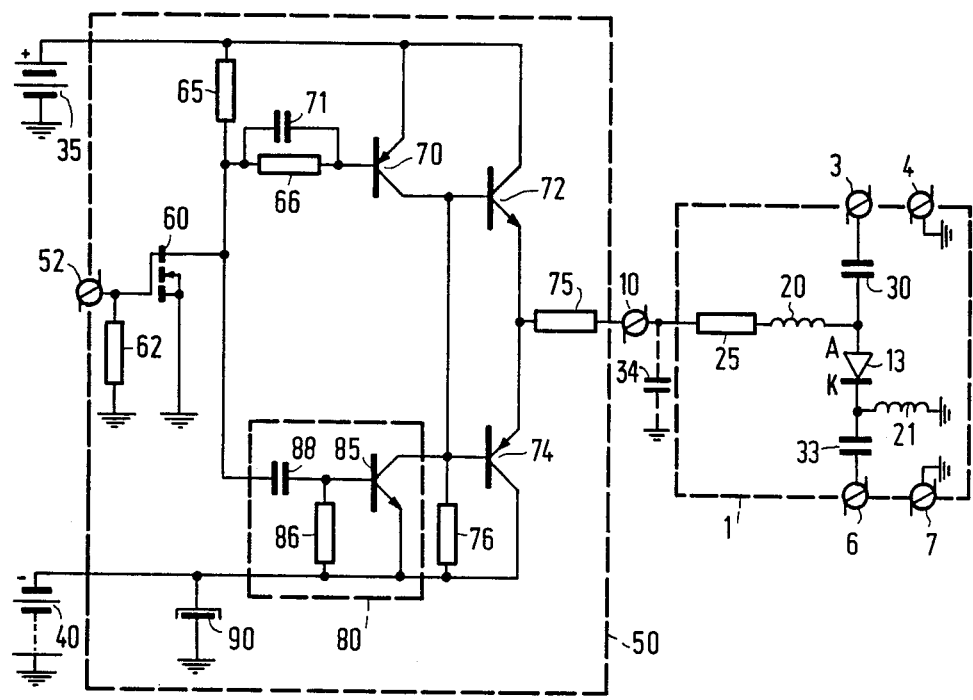

INTERRUPTER ARRANGEMENT FOR HIGH-FREQUENCY SIGNALS

BACKGROUND OF THE INVENTION

1. Field of the Invention

The present invention relates to an interrupter circuit arrangement for high-frequency signals, the arrangement comprising a switching circuit having a high-frequency signal path which includes at least one attenuation diode (more specifically PIN diodes), and a control terminal at which is received control signals from a control circuit for adjusting switching circuit to the conductive or the nonconductive state. A biasing circuit ensures that the high-frequency signals and the control signals are decoupled. The control circuit supplies the control signals in response to a command voltage applied thereto. Such signals are derived from either a first voltage source to render the signal path conductive or from a second voltage source to render it nonconductive.

Such an interrupter circuit arrangement can be used to great advantage. For example, several such arrangements can be combined to switch a high-frequency signal transmitter to various different load circuits.

2. Description of the Related Art

An arrangement of this type is described in U.S. Pat. No. 3,912,949. In said Patent it is recommended, in order to accelerate the change-of-state (conductive, non-conductive and nonconductive, conductive) to produce current peaks to retrieve the charge stored in the PIN diodes. Although this is very efficient for high-frequency signals of a low power, it is not applicable to signals of a high power (of the order of 100 Watts). Actually, at such a power, to ensure that the PIN diodes do not become conductive again in response to high frequency voltage peaks, whereas they should be non-conductive, it is necessary to provide a second blocking voltage source of a high value, exceeding the peak value of the high-frequency voltages. It is then possible to create, unless precautions are taken, current peaks which generate overvoltages which, when added to the high value of the second voltage source, may produce a considerable risk of causing breakdown of the PIN diodes.

In addition, it is important to provide an appropriate decoupling between the high-frequency signals, and the control signals, which in practice means that a bypass capacitance is necessary at the control terminal so as to shunt the high-frequency signals. Applicants have found that this capacitance is responsible for slowing down the supply of the control signals to the electrodes of the PIN diode(s).

SUMMARY OF THE INVENTION

The present invention has for its object to provide an interrupter circuit arrangement of the type defined in the opening paragraph which is particularly suitable for high-frequency signals (100 to 400 MHz) of a high power (100 W peak), utilising a second blocking voltage source of a high value, whilst still providing an appropriately rapid change of states.

Such an arrangement is characterized in that the control circuit comprises an overvoltage circuit which is triggered during the changeover from the first source so as to the second source to produce a charging current pulse for a bypass capacitor present at said control terminal, the attenuation diode(s) being arranged in series in the signal path.

BRIEF DESCRIPTION OF THE DRAWINGS

The following description is given by way of nonlimitative example with reference to the accompanying drawing, and will make it clear how the invention can be put into effect.

The sole FIG. 1 shows the arrangement according to the invention.

DESCRIPTION OF THE PREFERRED EMBODIMENTS

In FIG. 1, reference numeral 1 denotes a switching circuit having input terminals 3 and 4 for connection to a high-frequency signal generator (not shown), output terminals 6 and 7 for connection to a load (not shown), and a control terminal 10 for receiving a control signal. This control signal has for its object to render the high-frequency signal path comprised between the input terminals 3 and 4 and the output terminals 6 and 7 conductive or non-conductive. Put differently, this path is considered to be conductive when the signal applied to the terminals 3 and 4 is produced at the terinals 6 and 7, and non-conductive when no signal is produced at the terminals 6 and 7 while a signal is applied to the terminals 3 and 4. To render this path conductive or nonconductive, a PIN diode 13 is used to whose ends A and K a biasing voltage is applied which renders it either conductive or nonconductive. A biasing circuit supplies this voltage; it is constituted by the inductances 20 and 21. The inductance 21 connects, from the direct current point of view, the end K of the diode 13 to ground to which the terminals 4 and 7 are already connected. The inductance 20 interconnects the end A to the control terminal 10 via a resistor 25. The biasing circuit also includes two isolation capacitors 30 and 33 to insulate, with respect to the control signal, the end A from the terminal 3 and, on the other hand, the end K from the terminal 6. It should also be noted that a by-pass capacitor 34 is present at terminal 10, which shortcircuits to ground the residual high-frequency in the control signals. The value of this capacitance is of the order of 2000 pF and it is this capacitor which slows down the ascent and the descent of the control signals.

To render the diode 13 conductive, a voltage must be applied which is obtained from a first voltage source 35 which is positive relative to ground and whose electromotive force is 5 Volts. To cut off the diode 13, another voltage must be applied which is provided by a second voltage source 40 which is negative relative to ground and whose electromotive force has a value of 100 Volts. To apply these voltages to the terminal 10, the command voltage circuit 50 is used which, as a function of the control applied to the terminal 52, produces one of the two voltages from the sources 35 and 40. The command voltage has either of two logic levels; thus, a command voltage near 0 Volt causes the voltage of the source 40 to be applied to the terminal 10 and a command voltage near 5 Volts causes the application of the voltage of the source 35. This control circuit 50 is first of all constituted by a N-channel field-effect transistor 60 which thus constitutes a pre-amplifier having a high impedance at the terminal 52; its gate is connected to terminal 52 and also to ground via a high-value resistor 62 (approximately 100 kohms); the source is connected to ground and the drain to the junction of two resistors 65 and 66; the opposite points of these two resistors 65 and 66 are connected to a positive pole of the source 35 and to the base of a PNP transistor 70, respectively. A capacitor 71 shunts the resistor 66 to improve the speed of response of the transistor 70. The emitter of this transistor 70 is connected to the "+" pole of the source 35 and the collector to the base of a first NPN-type output transistor 72 and the base of a second PNP-type output transistor 74. These output transistors are a complementary pair; i.e. their emitters, which are interconnected, are connected to the terminal 10 via a resistor 75, their likewise interconnected bases are connected to the collector of the transistor 70 and to ground via a resistor 76. The collector of the transistor 72 is connected to the "+" pole of the source 35 and the collector of the transistor 74 is connected to the "−" pole of the source 40.

It is easy to understand the mode of operation of the assembly described in the foregoing.

When the command voltage at the terminal 52 is a logic "1", a 5 Volts voltage is present across this terminal and so, the FET transistor 60 is saturated; as a result the drain thereof is near ground potential and causes PNP transistor 70 also to become saturated so that its collector is positive. That renders transistor 72 is conductive and the PNP transistor 74 is cut-off since the potential at its base exceeds the potential at its emitter. The capacitor 34 is rapidly charged because of the fact that the diode 13 is conductive.

When the command voltage at the terminal 52 is a "0", the potential at the FET drain of the transistor 60 increases, rendering the transistor 70 non-conductive, which results in transistor 72 being blocked; the transistor 74 becomes conductive, its emitter current being fixed by the value of the biasing resistor 76 and also by the grid-leak resistances of the transistors 70 and 72. In view of the high value (−100 Volts) of the electromotive force of the source 40, it is necessary to take measures to avoid that transistor 74 must dissipate excessive power; for that reason the biasing resistor 76 can be given a high value. Thus, although the diode 13 is in the blocked state, a protection will be obtained from any impedance providing paths for unwanted leakage currents. However, the emitter current of the transistor 74 is so biased will be too weak to ensure a fast charging of the capacitor 34. For that reason the invention recommends to provide an overvoltage circuit 80 which is triggered during the change-over from the first source 35 to the second source 40 to supply a load current pulse for the capacitor 34 present at the terminal 10, via the transistor 74.

Since the load current pulse has a very short duration, the transistor 74 is only submitted to a high power to be dissipated during a short period of time, which does not entail the risk of it breaking down.

The overvoltage circuit 80 is constituted by a transistor 85 whose collector is connected to the base of the transistor 74. The emitter of the transistor 85 is connected to the "−" pole of the source 40, whilst its base is connected to the "−" pole of the source 40 via a resistor 86 and also to the drain of the transistor 60 via a capacitor 88 which together with the resistor 86 and the input resistance of the transistor 85 constitutes a differentiating network. Thus, the transistor 85 applies a current trigger pulse to the base of the transistor 74 at each leading edge of the voltage across the drain of the transistor 60 which occurs during the change-over from the first source to the second source. The duration of the trigger pulse produced by the circuit 80 depends in particular on the value of the capacitance of the capacitor 88. Consequently, a value is chosen for this capacitance which provides for an exponential charge of the capacitor 34, which is effected to avoid any overvoltage at the terminals of transistor 74.

When the overvoltage circuit is triggered, the voltage source 40 must produce a relatively high current and the voltage at its terminals can be reduced; to that end a high value capacitor 90 (storage capacitor) is provided which increases the efficiency of the source 40.

The following Table specifies the values of the different elements of the arrangement:

TABLE

| | Values |
|---|---|
| Resistors | |
| 25 | 27 ohms |
| 62 | 150 kohms |
| 65 | 2.2 kohms |
| 66 | 100 kohms |
| 75 | 10 ohms |
| 76 | 330 kohms |
| 86 | 150 kohms |
| Capacitor | |
| 30 | 470 pF |
| 33 | 470 pF |
| 35 | 1-2 nF |
| 71 | 1 nF |
| 88 | 1 nF |
| 90 | 3.9 µF |
| Inductances | |
| 20 | 1 µH |
| 21 | 1 µH |
| Semiconductors | |
| 13 | DH 801-01 |
| 60 | 2N6660 |
| 70 | 2N3634 |
| 72 | 2N720A |
| 74 | 2N3634 |
| 85 | 2N720A |

With such a configuration, a switching period of less than 5 µs for each change-over from the conductive state to the nonconductive state and vice versa is obtained.

This switching period is preserved for a repetition rate of the control signal less than or equal to 500 Hz.

What is claimed is:

1. An interrupter circuit arrangement for high frequency signals, comprising:

a switching circuit having a high-frequency signal path which includes at least one diode, said switching circuit having a control terminal for receiving control signals for biasing said diode to either conductive state or non-conductive state, and a high-frequency bypass capacitance at said control terminal;

a control circuit having an output connected to said control terminal for supplying said control signals thereto in response to command voltages supplied to an input of said control circuit, said control circuit producing such a control signal from a first voltage source when a command voltage signifies that said signal path is to be rendered conductive and producing such a control signal from a second voltage source of opposite polarity from said first voltage source when a command voltage signifies that said signal path is to be rendered non-conductive; and an overvoltage circuit comprised in said control circuit which produces a trigger pulse in response to a change-over from said first voltage source to said second voltage source, such trigger pulse causing said control circuit to produce a charging current trigger pulse at the output thereof for charging said bypass capacitance.

2. An interrupter circuit as claimed in claim 1, wherein said control circuit comprises a first output transistor having a collector-emitter path connected between said first voltage source and said control terminal, and a second output transistor having a collector-emitter path connected between said second voltage source and said control terminal; characterized in that said overvoltage circuit has an output connected to the base of said second output transistor, an input coupled to the input of said control circuit, and a differentiating network connected between such input and output; said differentiating network being responsive to said change-over from said first voltage source to said second voltage source to cause said control circuit to produce said charging current trigger pulse at the output thereof.

3. An interrupter circuit arrangement as claimed in claim 2, characterized in that said differentiating network has a time constant such that said charging current trigger pulse charges said bypass capacitor over a short period of time to limit power dissipation in second output transistor to an acceptable level.

4. An interrupter circuit arrangement as claimed in any of claims 1, 2, and 3, characterized in that a capacitor of relatively high capacitance is connected across the terminals of said second voltage source to stabilize the voltage thereof during said charging current trigger pulse.

* * * * *